(12) United States Patent
Lind

(10) Patent No.: US 7,088,177 B2
(45) Date of Patent: Aug. 8, 2006

(54) AMPLIFIER APPARATUS

(75) Inventor: Ryan Erik Lind, Jackson, MS (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/982,625

(22) Filed: Nov. 6, 2004

(65) Prior Publication Data

US 2006/0097784 A1 May 11, 2006

(51) Int. Cl.
*H03F 21/00* (2006.01)

(52) U.S. Cl. .................... 330/207 A; 330/251

(58) Field of Classification Search ............ 330/207 A, 330/10, 251, 85
See application file for complete search history.

(56) References Cited

U.S. PATENT DOCUMENTS 6,118,336 A * 9/2000 Pullen et al. ................. 330/10

6,339,360 B1 * 1/2002 Santillano ..................... 330/10

\* cited by examiner

*Primary Examiner*—Robert Pascal
*Assistant Examiner*—Hieu Nguyen
(74) *Attorney, Agent, or Firm*—W. James Brady, III; Frederick J. Telecky, Jr.

(57) ABSTRACT

An amplifier apparatus includes: (a) an integrator having an input for receiving an input signal, and integrating the input signal to present an integrated signal; (b) a first comparer coupled with the integrator for comparing the integrated signal with a varying reference signal to produce an output signal; and (c) a feedback circuit, coupled to receive the integrated signal and coupled with the input structure, that includes: (1) a second comparer coupled for receiving the integrated signal and comparing the integrated signal with a reference level related to the reference signal; the second comparer presents an actuating signal when the integrated signal has a predetermined relationship with the reference level; and (2) a switch coupled with the second comparer unit and with the input and responding to the actuating signal to affect the input signal appropriately to reduce the integrated signal when the actuating signal is at a predetermined level.

20 Claims, 4 Drawing Sheets

US 7,088,177 B2

AMPLIFIER APPARATUS

BACKGROUND OF THE INVENTION

The present invention is directed to electrical amplifier apparatuses, and especially to electrical amplifier apparatuses adaptively controlling output to accommodate signal clipping to improve recovery from signal clipping.

The present invention is generally useful in electrical signal amplifiers. The present invention is particularly advantageously employed in audio signal amplifying apparatuses. Amplification of electrical signals, and especially audio signals, is a challenging area of analog circuit design. Unlike some other linear circuits, audio systems are required to function with high fidelity over a broad dynamic range. While the average power required for most music listening (an example of use of an audio amplifying apparatus) is quite low, there can be peak output levels which are larger than the supply rail—the signal provided for operating the amplifier. When the output signal levels exceed the supply rail, clipping occurs at the outputs of the amplifier. Ideally the amplifier output signal will exactly match the shape of the input signal with a perfect cutoff for levels above the supply voltage. Class-AB power amplifiers typically will have no trouble achieving this kind of performance provided that good design techniques are employed. Class-D amplifiers however, which are rapidly increasing in popularity for audio amplifying applications, present challenging design issues in order to approach such ideal clipping performance.

A problem that may be experienced during a clipping condition in an amplifier is that, while clipping (i.e., while the output signal levels of the amplifier exceed the supply rail), may be illustrated by way of example and not by way of limitation, in the contest of an exemplary Class D amplifier. The exemplary amplifier receives input signals at an integrator unit. The integrator unit integrates the input signals (using integrating capacitors in a feedback arrangement, which will be described in greater detail hereinafter in connection with FIGS. 1–4. When a clipping condition exists, the amplifier output can no longer maintain proportionality with the input signals received by the amplifier. During this clipping condition, integrating capacitors continue to be charged, so that the output of an integrating unit becomes larger than the reference signal. When the input signal returns to a lower level at which clipping does not occur, the amplifier takes a finite time to reduce the excess charge that has been accumulated in the integrating capacitors during clipping conditions. After the excess charge is reduced, the amplifier can return to normal operations. The delay in reducing excess charge in the integrating capacitors causes distortion during clipping recovery. A user of an audio amplifier system can notice noise occasioned by the distortion that occurs during clipping recovery operation.

There is a need for an amplifier apparatus that can reduce time required for clipping recovery operations.

SUMMARY OF THE INVENTION

An amplifier apparatus includes: (a) an integrating unit having an input structure for receiving at least one input signal, and integrating the at least one input signal to present an integrated input-indicating signal; (b) a first comparing unit coupled with the integrating unit for comparing the integrated input-indicating signal with a varying reference signal to produce an output signal; and (c) a feedback circuit coupled to receive the integrated input-indicating signal and coupled with the input structure; the feedback circuit includes: (1) a second comparing unit coupled for receiving the integrated input-indicating signal and comparing the integrated input-indicating signal with a reference signal level related to the reference signal; the second comparing unit presents an actuating signal when the integrated input-indicating signal has a predetermined relationship with the reference signal level; and (2) a switching unit coupled with the second comparing unit and with at least one of the integrating unit and the input structure and responding to the actuating signal to affect the input signal appropriately to reduce the integrated input-indicating signal when the actuating signal is at a predetermined level.

It is, therefore, an object of the present invention to provide an amplifier apparatus that can reduce time required for clipping recovery operations.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
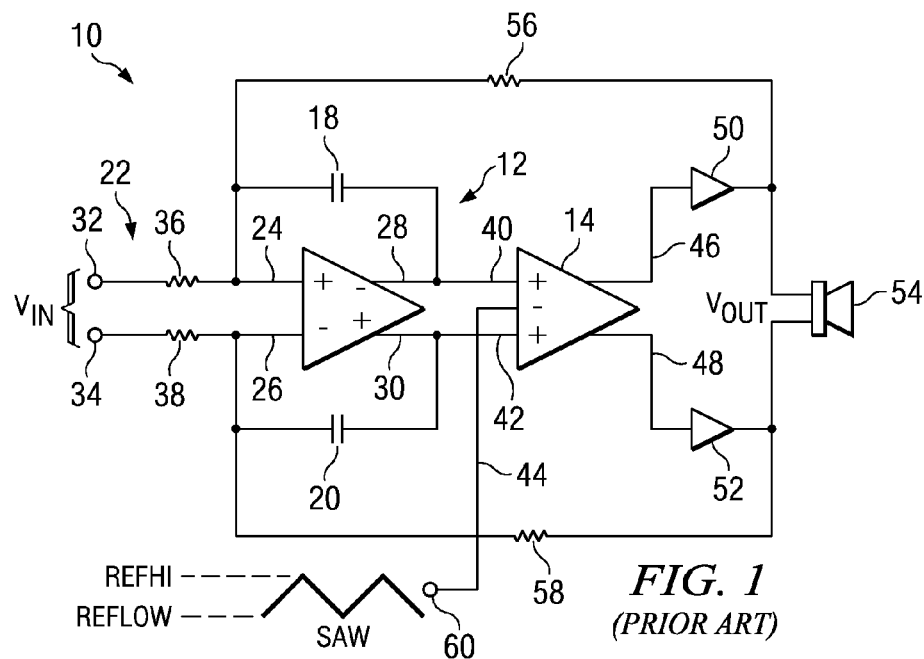
FIG. 1 is an electrical schematic diagram of an exemplary prior art amplifier apparatus configured for fully differential signal operation.

FIG. 1 is an electrical schematic diagram of an exemplary prior art amplifier apparatus configured for fully differential signal operation. In FIG. 1, an amplifier apparatus 10 includes an integrating unit 12, a comparing unit 14 and an input structure 22. Integrating unit 12 includes an integrating amplifier 16 and integrating capacitors 18, 20. Integrating amplifier 16 has input terminals 24, 26 and output terminals 28, 30. Input structure 22 includes input signal terminals 32, 34 and resistors 36, 38 coupled between input signal terminals 32, 34 and input terminals 24, 26. Integrating capacitor 18 is coupled between output terminal 28 and input terminal 24. Integrating capacitor 20 is coupled between output terminal 30 and input terminal 26. Integrating unit 12 receives input signals from input structure 22 via input terminals 22, 24 and presents integrated input-indicating signals at output terminals 28, 30. Apparatus 10 is configured for handling fully differential input signals received at signal input terminals 32, 34.

Comparing unit 14 has non-inverting input terminals 40, 42, an inverting input terminal 44 and output terminals 46, 48. Power drivers 50, 52 connect output terminals 46, 48 with a load 54. A resistor 56 couples load 54 and power driver 50 with input terminal 24. A resistor 58 couples load 54 and power driver 52 with input terminal 26. Inverting input terminal 44 is coupled with a reference signal input terminal 60. A reference signal SAW is received at reference signal input terminal 60 and compared by comparing unit 14 with integrated input-indicating signals received at input terminals 40, 42 from integrator output terminals 28, 30.

Apparatus 10 may be recognized by those skilled in the art as a pulse width modulated (PWM) amplifier circuit. Varying the period of reference signal SAW will vary the width of pulse output signals presented to load 54. That is, amplifier 10 converts an input signal $V_{IN}$ to a pulse width modulated (PWM) output signal $V_{OUT}$. Output signal $V_{OUT}$ has the frequency of reference input signal SAW received at reference signal input terminal 60. Output signal $V_{OUT}$ has a duty cycle determined by input signal $V_{IN}$, by resistors 36, 38, 56, 58 and by the supply voltage provided for operating apparatus 10 (not shown in FIG. 1). When apparatus 10 is employed as an audio amplifier, the audio content of output signal $V_{OUT}$ is the product of input signal $V_{IN}$ and one of the ratio of resistor 56 divided by resistor 36 and the ratio of resistor 58 divided by resistor 38. For fully duplex operations, it is preferred that the value of resistor 36 equals the value of resistor 38, and it is preferred that the value of resistor 56 equals the value of resistor 58. Apparatus 10 is a Class D amplifier. A significant advantage of a Class D amplifier is its superior efficiency over a Class AB amplifier. This is an important advantage when driving heavy loads such as speakers. The PWM signal is created by comparing the integrated input-indicating signals from integrating unit 12 with a reference voltage SAW. Reference signal SAW is preferably a sawtooth signal or another type of ramp voltage. As the integrated input-indicating signals swing farther apart the audio component of output signal $V_{OUT}$ increases until the integrated input-indicating signals exceed the reference signal SAW. When the integrated input-indicating signals exceed the reference signal SAW, output signal $V_{OUT}$ goes to 100% duty cycle which results in hard clipping.

Previous attempts to alleviate the problem of clipping output signal $V_{OUT}$ have included clamping the outputs of integrating unit 12. Designers thought that by keeping the outputs of integrating unit 12 from skewing during a clipping event one could prevent finite recovery time issues and thereby mitigate or remove the distortion in output signal $V_{OUT}$. While this solution offered some improvement it only moved the problem back one stage. By clamping the outputs of integrating unit 12 the local feedback loop (i.e., integrating capacitors 18, 20) of integrating unit 12 is broken which allows signals at input terminals 24, 26 to skew. As a result, distortion is reduced but it is still present, particularly during high speed transients.

In order to reduce the clipping recovery problem a new approach is disclosed herein which reduces the input signal to input terminals 24, 26 of integrating unit 12 whenever a clipping condition occurs. By reducing the input signal to input terminals 24, 26 skewing of the integrated input-indicating signals presented at output terminals 128, 130 is prevented. Maintaining the integrity of the local feedback loop (i.e., integrating capacitors 18, 20) prevents skewing of the inputs. The new feature is referred to herein as Adaptive Dynamic Range Control (ADRC) because it adaptively controls the dynamic range of the input signal based on the detection of a clipping event. ADRC looks at the integrated input-indicating signals presented by the integrating amplifier and attenuates the input signal when clipping is detected.

Figure 2:
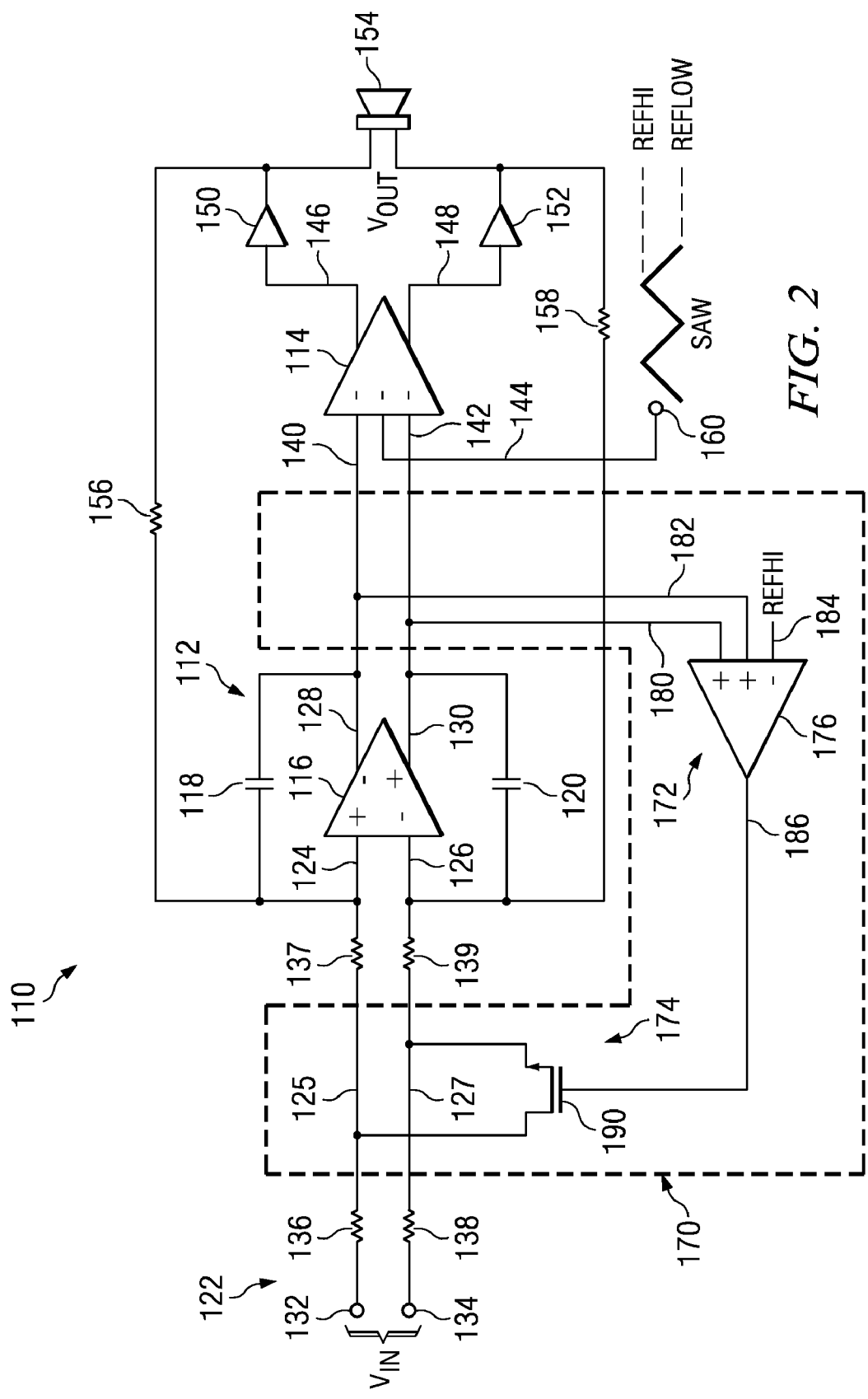
FIG. 2 is an electrical schematic diagram of a fully differential signal handling amplifier apparatus employing the preferred embodiment of the present invention for improving clipping recovery operation.

FIG. 2 is an electrical schematic diagram of a fully differential signal handling amplifier apparatus employing the preferred embodiment of the present invention for improving clipping recovery operation. In FIG. 2, an amplifier apparatus 110 includes an integrating unit 112, a comparing unit 114 and an input structure 122. Integrating unit 112 includes an integrating amplifier 116 and integrating capacitors 118, 120. Integrating amplifier 116 has input terminals 124, 126 and output terminals 128, 130. Input structure 122 includes an input signal terminal 132 and resistors 136, 137 coupled in series by an input signal line 125 between input signal terminal 132 and input terminal 124. Input structure 122 also includes an input signal terminal 134 and resistors 138, 139 coupled in series by an input signal line 127 between input signal terminal 134 and input terminal 126. Integrating capacitor 118 is coupled between output terminal 128 and input terminal 124. Integrating capacitor 120 is coupled between output terminal 130 and input terminal 126. Integrating unit 112 receives input signals from input structure 122 via input terminals 122, 124 and presents integrated input-indicating signals at output terminals 128, 130. Apparatus 110 is configured for handling fully differential input signals received at signal input terminals 132, 134.

Comparing unit 114 has non-inverting input terminals 140, 142, an inverting input terminal 144 and output terminals 146, 148. Amplifiers 150, 152 connect output terminals 146, 148 with a load 154. A resistor 156 couples load 154 and amplifier 150 with input terminal 124. A resistor 158 couples load 154 and amplifier 152 with input terminal 126. Inverting input terminal 144 is coupled with a reference signal input terminal 160. A reference signal SAW is received at reference signal input terminal 160 and compared by comparing unit 114 with integrated input-indicating signals received at input terminals 140,142 from integrator output terminals 128, 130.

Apparatus 110 may be recognized by those skilled in the art as a fully differential pulse width modulated (PWM) amplifier circuit. Varying the period of reference signal SAW will vary the width of pulse output signals presented to load 154. That is, amplifier 110 converts an input signal $V_{IN}$ to a pulse width modulated (PWM) output signal $V_{OUT}$. Output signal $V_{OUT}$ has the frequency of reference input signal SAW received at reference signal input terminal 160. Output signal $V_{OUT}$ has a duty cycle determined by input signal $V_{IN}$, by resistors 136, 138, 156, 158 and by the supply voltage provided for operating apparatus 110 (not shown in FIG. 2). When apparatus 110 is employed as an audio amplifier, the audio content of output signal $V_{OUT}$ is the product of input signal $V_{IN}$ and one of the ratio of resistor 156 divided by resistor 136 and the ratio of resistor 158 divided by resistor 138. For fully duplex operations, it is preferred that the value of resistor 136 equals the value of resistor 138, and it is preferred that the value of resistor 156 equals the value of resistor 158. Apparatus 110 is a Class D amplifier. A significant advantage of a Class D amplifier is its superior efficiency over a Class AB amplifier. This is an important advantage when driving heavy loads such as speakers. As described briefly earlier herein, the PWM signal is created by comparing the integrated input-indicating signals from integrating unit 112 with a reference voltage SAW. Reference signal SAW is preferably a sawtooth signal or another type of ramp voltage.

Apparatus 110 also includes an adaptive dynamic range control (ADRC) unit 170. ADRC unit 170 includes a clipping detector section 172 and an input attenuation section 174. Clipping detector section includes a comparing unit 176 having non-inverting input terminals 180, 182, an inverting input terminal 184 and an output terminal 186.

Non-inverting input terminals 180, 182 are coupled with output terminals 128, 130 of integrating unit 112 to receive integrated input-indicating signals from integrating unit 112. Inverting input terminal 184 receives a reference signal having a relationship with reference signal SAW, such as REFHI, the maximum value of reference signal SAW.

Input attenuation section 174 is embodied in a transistor 190 coupled across input signal lines 125, 127. Preferably transistor 190 is coupled with signal line 125 between resistors 136, 137. Preferably transistor 190 is coupled with signal line 127 between resistors 138, 139. Transistor 190 responds to output signals presented at output terminal 186 to switchingly couple signal lines 125, 127, thereby preventing further skewing of integrated input-indicating signals presented at output terminals 128, 130.

As the integrated input-indicating signals presented at output terminals 128, 130 swing farther apart output signal $V_{OUT}$ increases. Clipping is detected by comparing each of the integrated input-indicating signals presented at output terminals 128, 130 to the reference signal provided at input terminal 184 (i.e., REFHI; the maximum value of reference signal SAW). When either of the integrated input-indicating signals presented at output terminals 128, 130 exceeds the maximum ramp voltage (i.e., REFHI) a clipping event has occurred. In that event, an output signal is presented at output terminal 186 and transistor 190 responds to connect signal lines 125, 127 in common. In such manner, the input signal path is attenuated via the voltage controlled switch (i.e., transistor 190) inserted in the signal path.

In order to prevent noise injected onto the REFHI signal from causing a false detection of clipping, a low pass RC (resistive-capacitive) filter may be employed between outputs 128, 138 and comparing unit 176 (not shown in FIG. 2).

Figure 3:
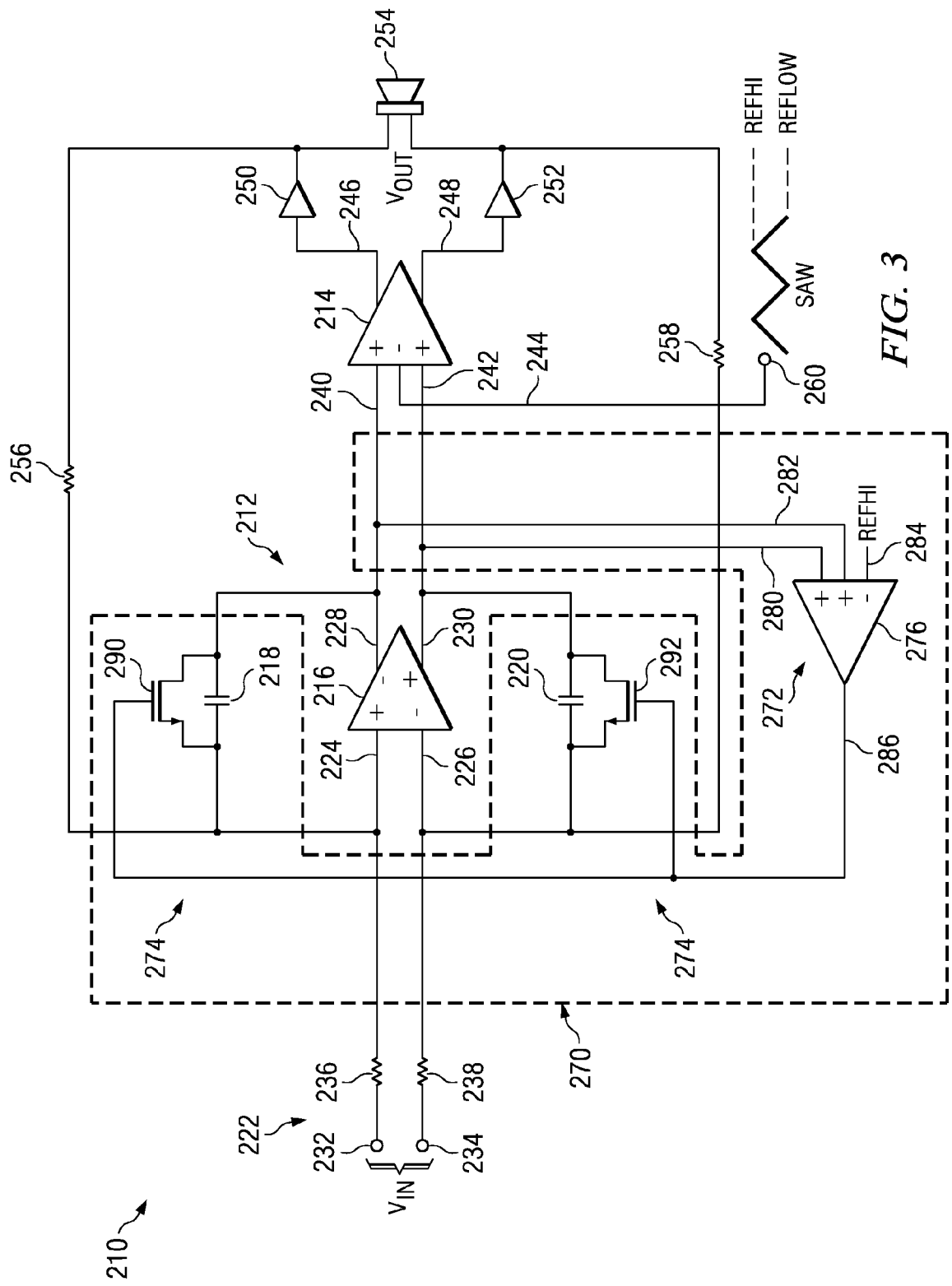
FIG. 3 is an electrical schematic diagram of a fully differential signal handling amplifier apparatus employing an alternate embodiment of the present invention for improving clipping recovery operation.

FIG. 3 is an electrical schematic diagram of a fully differential signal handling amplifier apparatus employing an alternate embodiment of the present invention for improving clipping recovery operation. In FIG. 3, an amplifier apparatus 210 includes an integrating unit 212, a comparing unit 214 and an input structure 222. Integrating unit 212 includes an integrating amplifier 216 and integrating capacitors 218, 220. Integrating amplifier 216 has input terminals 224, 226 and output terminals 228, 230. Input structure 222 includes input signal terminals 232, 234 and resistors 236, 238 coupled between input signal terminals 232, 234 and input terminals 224, 226. Integrating capacitor 218 is coupled between output terminal 228 and input terminal 224. Integrating capacitor 220 is coupled between output terminal 230 and input terminal 226. Integrating unit 212 receives input signals from input structure 222 via input terminals 222, 224 and presents integrated input-indicating signals at output terminals 228, 230. Apparatus 210 is configured for handling fully differential input signals received at signal input terminals 232, 234.

Comparing unit 214 has non-inverting input terminals 240, 242, an inverting input terminal 244 and output terminals 246, 248. Amplifiers 250, 252 connect output terminals 246, 248 with a load 254. A resistor 256 couples load 254 and amplifier 250 with input terminal 224. A resistor 258 couples load 254 and amplifier 252 with input terminal 226. Inverting input terminal 244 is coupled with a reference signal input terminal 260. A reference signal SAW is received at reference signal input terminal 260 and compared by comparing unit 214 with integrated input-indicating signals received at input terminals 240, 242 from integrator output terminals 228, 230.

Apparatus 210 may be recognized by those skilled in the art as a fully differential pulse width modulated (PWM) amplifier circuit. Varying the period of reference signal SAW will vary the width of pulse output signals presented to load 254. That is, amplifier 210 converts an input signal $V_{IN}$ to a pulse width modulated (PWM) output signal $V_{OUT}$. Output signal $V_{OUT}$ has the frequency of reference input signal SAW received at reference signal input terminal 260. Output signal $V_{OUT}$ has a duty cycle determined by input signal $V_{IN}$, by resistors 236, 238, 256, 258 and by the supply voltage provided for operating apparatus 210 (not shown in FIG. 3). When apparatus 210 is employed as an audio amplifier, the audio content of output signal $V_{OUT}$ is the product of input signal $V_{IN}$ and one of the ratio of resistor 256 divided by resistor 236 and the ratio of resistor 258 divided by resistor 238. For fully duplex operations, it is preferred that the value of resistor 236 equals the value of resistor 238, and it is preferred that the value of resistor 256 equals the value of resistor 258. Apparatus 210 is a Class D amplifier. A significant advantage of a Class D amplifier is its superior efficiency over a Class AB amplifier. This is an important advantage when driving heavy loads such as speakers. As described briefly earlier herein, the PWM signal is created by comparing the integrated input-indicating signals from integrating unit 212 with a reference voltage SAW. Reference signal SAW is preferably a sawtooth signal or another type of ramp voltage.

Apparatus 210 also includes an adaptive dynamic range control (ADRC) unit 270. ADRC unit 270 includes a clipping detector section 272 and an input attenuation section 274. Clipping detector section includes a comparing unit 276 having non-inverting input terminals 280, 282, an inverting input terminal 284 and an output terminal 286. Non-inverting input terminals 280, 282 are coupled with output terminals 228, 230 of integrating unit 212 to receive integrated input-indicating signals from integrating unit 212. Inverting input terminal 284 receives a reference signal having a relationship with reference signal SAW, such as REFHI, the maximum value of reference signal SAW.

Input attenuation section 274 is embodied in transistors 290, 292. Transistor 290 is coupled in parallel with integrating capacitor 218. Transistor 292 is coupled in parallel with integrating capacitor 220. Transistors 290, 292 respond to output signals presented at output terminal 286 to switchingly short integrating capacitors 218, 220, thereby preventing further skewing of integrated input-indicating signals presented at output terminals 228, 230.

As the integrated input-indicating signals presented at output terminals 228, 230 swing farther apart output signal $V_{OUT}$ increases. Clipping is detected by comparing each of the integrated input-indicating signals presented at output terminals 228, 230 to the reference signal provided at input terminal 284 (i.e., REFHI; the maximum value of reference signal SAW). When either of the integrated input-indicating signals presented at output terminals 228, 230 exceeds the maximum ramp voltage (i.e., REFHI) a clipping event has occurred. In that event, an output signal is presented at output terminal 286 and transistors 290, 292 respond to short integrating capacitors 218, 220. In such manner, the input signal path is attenuated via the voltage controlled switch (i.e., transistors 290, 292) inserted in the signal feedback path.

In order to prevent noise injected onto the REFHI signal from causing a false detection of clipping, a low pass RC (resistive-capacitive) filter may be employed between outputs 228, 238 and comparing unit 276 (not shown in FIG. 3).

Figure 4:
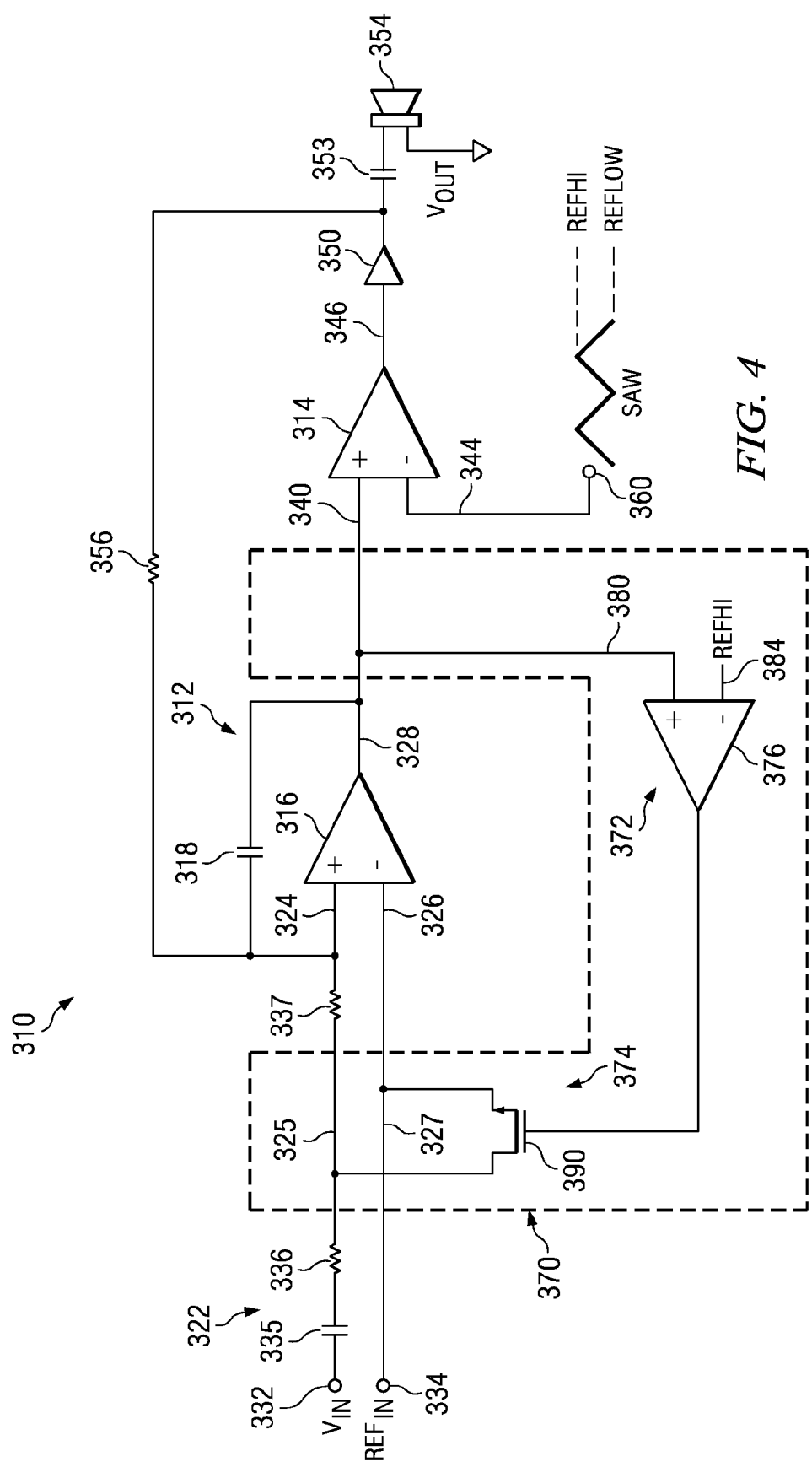
FIG. 4 is an electrical schematic diagram of a single signal handling amplifier apparatus employing the preferred embodiment of the present invention for improving clipping recovery operation.

FIG. 4 is an electrical schematic diagram of a single signal handling amplifier apparatus employing the preferred embodiment of the present invention for improving clipping recovery operation. In FIG. 4, an amplifier apparatus 310 includes an integrating unit 312, a comparing unit 314 and an input structure 322. Integrating unit 312 includes an integrating amplifier 316 and an integrating capacitor 318. Integrating amplifier 316 has an input terminal 324 and an output terminal 328. Input structure 322 includes an input signal terminal 332 and resistors 336, 337 coupled in series by an input signal line 325 between input signal terminal 332 and input terminal 324. A capacitor is coupled between input terminal 324 and resistor 333. Input structure 322 also includes an input signal terminal 334 coupled by an input signal line 327 with input terminal 126. A reference signal $REF_{IN}$ is provided at input terminal 334. Integrating capacitor 318 is coupled between output terminal 328 and input terminal 324. Integrating unit 312 receives input signals from input signal terminal 332 in input structure 322 via input terminals 322 and presents an integrated input-indicating signal at output terminal 328. Apparatus 310 is a single-ended amplifier configured for handling input signals received at signal input terminal 332.

Comparing unit 314 has a non-inverting input terminal 340, an inverting input terminal 344 and an output terminal 346. An amplifier 350 connects output terminal 346 with a load 354. A resistor 356 couples load 354 and amplifier 350 with input terminal 324. Inverting input terminal 344 is coupled with a reference signal input terminal 360. A reference signal SAW is received at reference signal input terminal 360 and compared by comparing unit 314 with integrated input-indicating signals received at input terminal 340 from integrator output terminal 328.

Apparatus 310 may be recognized by those skilled in the art as a single-ended pulse width modulated (PWM) amplifier circuit. Varying the period of reference signal SAW will vary the width of pulse output signals presented to load 354. That is, amplifier 310 converts an input signal $V_{IN}$ to a pulse width modulated (PWM) output signal $V_{OUT}$. Output signal $V_{OUT}$ has the frequency of reference input signal SAW received at reference signal input terminal 360. Output signal $V_{OUT}$ has a duty cycle determined by input signal $V_{IN}$, by resistors 136, 156 and by the supply voltage provided for operating apparatus 310 (not shown in FIG. 4). When apparatus 310 is employed as an audio amplifier, the audio content of output signal $V_{OUT}$ is the product of input signal $V_{IN}$ and the ratio of resistor 356 divided by resistor 336. Apparatus 310 is a single-ended Class D amplifier. A significant advantage of a Class D amplifier is its superior efficiency over a Class AB amplifier. This is an important advantage when driving heavy loads such as speakers. As described briefly earlier herein, the PWM signal is created by comparing the integrated input-indicating signals from integrating unit 312 with a reference voltage SAW. Reference signal SAW is preferably a sawtooth signal or another type of ramp voltage.

Apparatus 310 also includes an adaptive dynamic range control (ADRC) unit 370. ADRC unit 370 includes a clipping detector section 372 and an input attenuation section 374. Clipping detector section includes a comparing unit 376 having a non-inverting input terminal 380, an inverting input terminal 384 and an output terminal 386. Non-inverting input terminal 380 is coupled with output terminal 328 of integrating unit 312 to receive integrated input-indicating signals from integrating unit 312. Inverting input terminal 384 receives a reference signal having a relationship with reference signal SAW, such as REFHI, the maximum value of reference signal SAW.

Input attenuation section 374 is embodied in a transistor 390 coupled across input signal lines 325, 327. Preferably transistor 390 is coupled with signal line 125 between resistors 336, 337. Transistor 390 responds to output signals presented at output terminal 386 to switchingly couple signal lines 325, 327, thereby preventing further increasing of the integrated input-indicating signal presented at output terminal 328.

As the integrated input-indicating signal presented at output terminal 328 increases $V_{OUT}$ increases. Clipping is detected by comparing the integrated input-indicating signal presented at output terminal 328 to the reference signal provided at input terminal 384 (i.e., REFHI; the maximum value of reference signal SAW). When the integrated input-indicating signal presented at output terminal 328 exceeds the maximum ramp voltage (i.e., REFHI) a clipping event has occurred. In that event, an output signal is presented at output terminal 386 and transistor 390 responds to connect signal lines 325, 327 in common. In such manner, the input signal path is attenuated via the voltage controlled switch (i.e., transistor 390) inserted in the signal path.

In an alternate embodiment substantially similar to apparatus 210 (FIG. 3), transistor 390 may coupled in parallel with integrating capacitor 318. In this alternate embodiment (not shown in FIG. 4) transistor 390 responds to output signals presented at output terminal 386 to switchingly short integrating capacitor 318 thereby preventing further increasing of the integrated input-indicating signal presented at output terminal 328.

In order to prevent noise injected onto the REFHI signal from causing a false detection of clipping, a low pass RC (resistive-capacitive) filter may be employed between output 328 and comparing unit 376 (not shown in FIG. 4).

An offset may be intentionally added to the ARDC reference signal (i.e., signal REFHI received at input terminal 184, FIG. 2; input terminal 284, FIG. 3; input terminal 384, FIG. 4) to ensure that a 100% duty cycle is achieved during clipping operations. A small amount of offset voltage will have minimal effect on distortion of output signal $V_{OUT}$ during clipping recovery.

By changing the value of ARDC reference signal (i.e., signal REFHI received at input terminal 184, FIG. 2; input terminal 284, FIG. 3; input terminal 384, FIG. 4), from the highest value of reference signal SAW to a lower value, the ARDC unit (i.e., ARDC 170, FIG. 2; ARDC 270, FIG. 3; ARDC 370, FIG. 4) will effectively force clipping at a level lower than the supply voltage, which will reduce the available power to the load. In this sense ARDC 170, 270, 370 could be regarded as a maximum duty cycle limiter. Further, by limiting the maximum duty cycle of output signal $V_{OUT}$ one may guarantee that output signal will always be switching at the frequency of reference signal SAW. Such a condition is desirable for some applications where extra EMI (electromotive interference) caused by intermittent signal discontinuation caused by switching would be detrimental.

Figure 5:
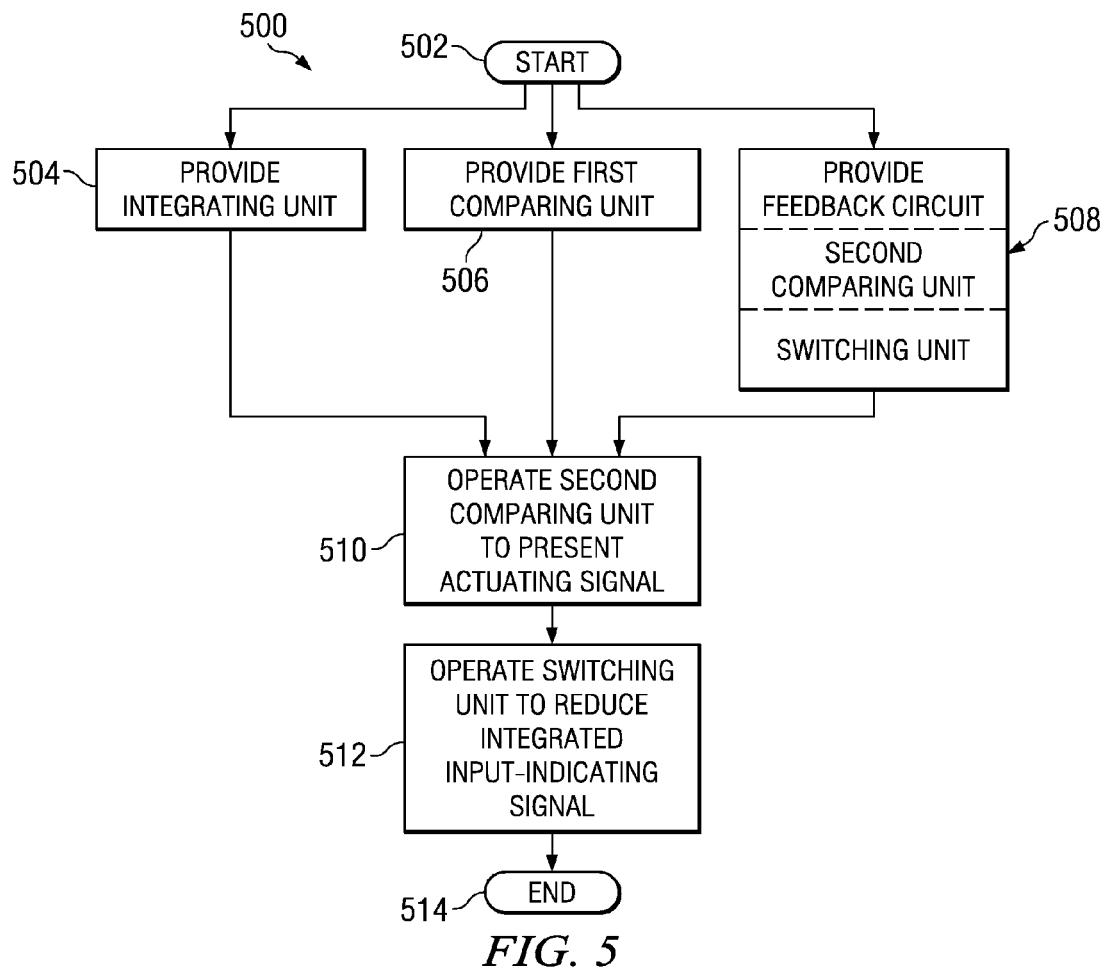
FIG. 5 is a flow diagram illustrating the method of the present invention.

FIG. 5 is a flow diagram illustrating the method of the present invention. In FIG. 5, a method 500 for operating an amplifier apparatus begins at a START locus 502. The apparatus receives at least one input signal at an input structure. Method 500 continues with the step of, in no particular order: (1) providing an integrating unit coupled with the input structure for integrating the at least one input signal and presenting an integrated input-indicating signal, as indicated by a block 504; (2) providing a first comparing unit coupled with the integrating unit for comparing the integrated input-indicating signal with a varying reference signal to produce an output signal, as indicated by a block 506; and (3) providing a feedback circuit coupled to receive the integrated input-indicating signal and coupled with the input structure, as indicated by a block 508. The feedback circuit includes: (a) a second comparing unit coupled for receiving the integrated input-indicating signal; and (b) a switching unit coupled with the second comparing unit and with at least one of the integrating unit and the input structure.

Method 500 continues with the step of operating the second comparing unit to compare the integrated input-indicating signal with a reference signal level related to the reference signal, as indicated by a block 510. The second comparing unit presents an actuating signal when the integrated input-indicating signal has a predetermined relationship with the reference signal level.

Method 500 continues with the step of operating the switching unit to respond to the actuating signal to affect the input signal appropriately to reduce the integrated input-indicating signal when the actuating signal is at a predetermined level, as indicated by a block 512. Method 500 terminates at an END locus 514.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An amplifier apparatus; the apparatus receiving at least one input signal at an input structure; the apparatus comprising:
   (a) an integrating unit; said integrating unit being coupled with said input structure; said integrating unit integrating said at least one input signal and presenting an integrated input-indicating signal;
   (b) a first comparing unit coupled with said integrating unit; said first comparing unit comparing said integrated input-indicating signal with a varying reference signal to produce an output signal; and
   (c) a feedback circuit coupled to receive said integrated input-indicating signal and coupled with said input structure; said feedback circuit comprising:
      (1) a second comparing unit coupled for receiving said integrated input-indicating signal; said second comparing unit comparing said integrated input-indicating signal with a reference signal level related to said reference signal; said second comparing unit presenting an actuating signal when said integrated input-indicating signal has a predetermined relationship with said reference signal level; and
      (2) a switching unit coupled with said second comparing unit and with at least one of said integrating unit and said input structure; said switching unit responding to said actuating signal to affect said input signal appropriately to reduce said integrated input-indicating signal when said actuating signal is at a predetermined level.

2. An amplifier apparatus as recited in claim 1 wherein said at least one input signal is a first input signal carried on a first input line and a second input signal carried on a second input line; said first input signal and said second input signal operating as a differential pair of input signals.

3. An amplifier apparatus as recited in claim 1 wherein said at least one input signal is a first input signal carried on a first input line and a second input signal carried on a second input line; said first input signal being a single information-indicating input signal; said second input signal being a reference input signal.

4. An amplifier apparatus as recited in claim 2 wherein said switching unit is coupled with said input structure and responds to said actuating signal to couple said first input line with said second input line.

5. An amplifier apparatus as recited in claim 3 wherein said switching unit is coupled with said input structure and responds to said actuating signal to couple said first input line with said second input line.

6. An amplifier apparatus as recited in claim 2 wherein said integrating unit effects said integrating by employing charging of at least one integrating capacitor, and wherein said switching unit is coupled with said integrating unit and responds to said actuating signal to short said at least one integrating capacitor.

7. An amplifier apparatus as recited in claim 3 wherein said integrating unit effects said integrating by employing charging of at least one integrating capacitor, and wherein said switching unit is coupled with said integrating unit and responds to said actuating signal to short said at least one integrating capacitor.

8. An amplifier apparatus as recited in claim 1 wherein said varying reference signal is a sawtooth reference signal.

9. An amplifier apparatus programmable to adjust a maximum power output level; the apparatus receiving at least one input signal at an input structure; the apparatus comprising:
   (a) an integrating unit; said integrating unit being coupled with said input structure; said integrating unit integrating said at least one input signal and presenting an integrated input-indicating signal;
   (b) a first comparing unit coupled with said integrating unit; said first comparing unit comparing said integrated input-indicating signal with a varying reference signal to produce an output signal; said output signal varying according to a duty cycle; and
   (c) a feedback circuit coupled to receive said integrated input-indicating signal and coupled with said input structure; said feedback circuit comprising:
      (1) a second comparing unit coupled for receiving said integrated input-indicating signal; said second comparing unit comparing said integrated input-indicating signal with a reference signal level related to said reference signal; said second comparing unit presenting an actuating signal when said integrated input-indicating signal has a predetermined relationship with said reference signal level; and
      (2) a switching unit coupled with said second comparing unit and with at least one of said integrating unit and said input structure; said switching unit responding to said actuating signal to affect said input signal appropriately to reduce said integrated input-indicating signal when said actuating signal is at a predetermined level;
   said reference signal level being variable; varying said reference signal level effecting varying said duty cycle to adjust said maximum power output level.

10. An amplifier apparatus programmable to adjust a maximum power output level as recited in claim 9 wherein said varying reference signal is a sawtooth reference signal.

11. An amplifier apparatus programmable to adjust a maximum power output level as recited in claim 9 wherein said at least one input signal is a first input signal carried on a first input line and a second input signal carried on a second input line; said first input signal and said second input signal operating as a differential pair of input signals.

12. An amplifier apparatus programmable to adjust a maximum power output level as recited in claim 11 wherein said switching unit is coupled with said input structure and responds to said actuating signal to couple said first input line with said second input line.

13. An amplifier apparatus programmable to adjust a maximum power output level as recited in claim 11 wherein said integrating unit effects said integrating by employing charging of at least one integrating capacitor, and wherein said switching unit is coupled with said integrating unit and responds to said actuating signal to short said at least one integrating capacitor.

14. An amplifier apparatus programmable to adjust a maximum power output level as recited in claim 10 wherein said at least one input signal is a first input signal carried on a first input line and a second input signal carried on a second input line; said first input signal and said second input signal operating as a differential pair of input signals.

15. An amplifier apparatus programmable to adjust a maximum power output level as recited in claim 14 wherein said switching unit is coupled with said input structure and responds to said actuating signal to couple said first input line with said second input line.

16. An amplifier apparatus programmable to adjust a maximum power output level as recited in claim 15 wherein said integrating unit effects said integrating by employing charging of at least one integrating capacitor, and wherein said switching unit is coupled with said integrating unit and responds to said actuating signal to short said at least one integrating capacitor.

17. A method for operating an amplifier apparatus; the apparatus receiving at least one input signal at an input structure; the method comprising the steps of:

(a) in no particular order:

(1) providing an integrating unit; said integrating unit being coupled with said input structure; said integrating unit integrating said at least one input signal and presenting an integrated input-indicating signal;

(2) providing a first comparing unit coupled with said integrating unit; said first comparing unit comparing said integrated input-indicating signal with a varying reference signal to produce an output signal; and (3) providing a feedback circuit coupled to receive said integrated input-indicating signal and coupled with said input structure; said feedback circuit comprising:

[a] a second comparing unit coupled for receiving said integrated input-indicating signal; and

[b] a switching unit coupled with said second comparing unit and with at least one of said integrating unit and said input structure;

(b) operating said second comparing unit to compare said integrated input-indicating signal with a reference signal level related to said reference signal; said second comparing unit presenting an actuating signal when said integrated input-indicating signal has a predetermined relationship with said reference signal level; and (c) operating said switching unit to respond to said actuating signal to affect said input signal appropriately to reduce said integrated input-indicating signal when said actuating signal is at a predetermined level.

18. A method for operating an amplifier apparatus as recited in claim 17 wherein said varying reference signal is a sawtooth reference signal.

19. A method for operating an amplifier apparatus as recited in claim 17 wherein said at least one input signal is a first input signal carried on a first input line and a second input signal carried on a second input line; said first input signal and said second input signal operating as a differential pair of input signals.

20. A method for operating an amplifier apparatus as recited in claim 19 wherein said switching unit is coupled with said input structure and responds to said actuating signal to couple said first input line with said second input line.

* * * * *